US 9,196,213 B2

(12) United States Patent
Kim et al.

(10) Patent No.: US 9,196,213 B2
(45) Date of Patent: Nov. 24, 2015

(54) GATE DRIVING CIRCUIT AND DISPLAY DEVICE HAVING THE SAME

(71) Applicant: SAMSUNG DISPLAY CO., LTD., Yongin, Gyeonggi-Do (KR)

(72) Inventors: CheolKyu Kim, Seoul (KR); Sanghyun Jeon, Suwon-si (KR); Jihoon Oh, Daegu (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/578,080

(22) Filed: Dec. 19, 2014

(65) Prior Publication Data

US 2015/0206500 A1  Jul. 23, 2015

(30) Foreign Application Priority Data

Jan. 22, 2014 (KR) .................. 10-2014-0007840

(51) Int. Cl.
*H03K 17/687* (2006.01)
*G09G 3/36* (2006.01)
*G09G 5/00* (2006.01)
*H03K 17/16* (2006.01)

(52) U.S. Cl.
CPC ............ *G09G 3/3696* (2013.01); *G09G 3/3677* (2013.01); *H03K 17/165* (2013.01); *H03K 17/6874* (2013.01); *G09G 2330/027* (2013.01); *G09G 2330/04* (2013.01)

(58) Field of Classification Search
CPC ............ H03K 17/165; H03K 17/6874; G09G 3/3696; G09G 3/3674; G09G 3/3677; G09G 2330/04; G09G 2330/027
USPC ............. 345/100, 204, 211; 327/427; 257/43, 257/57, 59, 72, E27.111, E29.291, 257/E29.296, E33.053, E21.704; 438/104, 438/151, 155, 158
See application file for complete search history.

(56) References Cited

U.S. PATENT DOCUMENTS 7,847,291 B2  12/2010  Yoon et al.
8,067,775 B2  11/2011  Miyairi et al.
(Continued)

FOREIGN PATENT DOCUMENTS

KR   10-2011-0056621   5/2011
KR   10-1108176       1/2012
KR   10-2012-0060364  6/2012

OTHER PUBLICATIONS

Korean Patent Abstracts Publication No. 10-2012-0004786, dated Jan. 13, 2012, for KR 10-1108176, 1 page.

*Primary Examiner* — Dao H Nguyen
(74) *Attorney, Agent, or Firm* — Christie, Parker & Hale, LLP

(57) ABSTRACT

A gate driving circuit includes: a plurality of driving stages configured to apply gate signals to a plurality of pixels of a display panel, one driving stage of the driving stages including: a thin film transistor including a first control electrode, an active part overlapping the first control electrode, an input electrode overlapping the active part, an output electrode overlapping the active part, and a second control electrode on the first control electrode and the active part; and a control voltage generator configured to supply a control voltage determined according to a channel characteristic of the thin film transistor to the second control electrode and to include a voltage generating thin film transistor including an active part having a same channel characteristic as the active part of the thin film transistor.

20 Claims, 10 Drawing Sheets

(56) References Cited

U.S. PATENT DOCUMENTS

| | | |
|---|---|---|
| 8,237,878 B2 | 8/2012 | Shim et al. |
| 8,278,162 B2 | 10/2012 | Akimoto et al. |
| 8,941,576 B2 * | 1/2015 | Kang et al. .................... 345/100 |
| 9,035,933 B2 * | 5/2015 | Lin et al. ........................ 345/211 |
| 2009/0189677 A1 * | 7/2009 | Lee et al. ....................... 327/427 |
| 2009/0206332 A1 | 8/2009 | Son et al. |
| 2010/0244029 A1 | 9/2010 | Yamazaki et al. |
| 2011/0012117 A1 | 1/2011 | Yamazaki et al. |
| 2011/0017995 A1 | 1/2011 | Yamazaki et al. |
| 2011/0122117 A1 * | 5/2011 | Lee et al. ....................... 345/211 |
| 2011/0210325 A1 | 9/2011 | Sakakura et al. |
| 2014/0055436 A1 * | 2/2014 | Han et al. ....................... 345/211 |

\* cited by examiner

GATE DRIVING CIRCUIT AND DISPLAY DEVICE HAVING THE SAME

CROSS-REFERENCE TO RELATED APPLICATION

This application claims priority to and the benefit of Korean Patent Application No. 10-2014-0007840, filed on Jan. 22, 2014, the content of which is hereby incorporated by reference in its entirety.

BACKGROUND

1. Field

Embodiments of the present disclosure relate to a gate driving circuit and a display device having the same.

2. Description of the Related Art

A display device includes gate lines, data lines, and pixels connected to the gate lines and data lines. The display device includes a gate driving circuit to sequentially apply gate signals to the gate lines and a data driving circuit to apply data signals to the data lines.

The gate driving circuit includes a shift register configured to include driving stages, e.g., driving stage circuits. Each driving stage outputs the gate signal corresponding to the gate lines. Each driving stage includes transistors connected to each other.

SUMMARY

An aspect of an embodiment of the present disclosure is directed toward a gate driving circuit capable of outputting a gate signal having a set voltage level (e.g., a predetermined level).

An aspect of an embodiment of the present disclosure is directed toward a display device capable of reducing (e.g., preventing) a horizontal line from being displayed.

An aspect of an embodiment of the present disclosure relates to a gate driving circuit having superior operation characteristic and improved display quality and a display device having the gate driving circuit.

In one embodiment of the present invention, there is provided a gate driving circuit including: a plurality of driving stages configured to apply gate signals to a plurality of pixels of a display panel, one driving stage of the driving stages including: a thin film transistor including a first control electrode, an active part overlapping the first control electrode, an input electrode overlapping the active part, an output electrode overlapping the active part, and a second control electrode on the first control electrode and the active part; and a control voltage generator configured to supply a control voltage determined according to a channel characteristic of the thin film transistor to the second control electrode and to include a voltage generating thin film transistor including an active part having a same channel characteristic as the active part of the thin film transistor.

In one embodiment, the control voltage generator includes: a first voltage generating thin film transistor including an input electrode configured to receive a first voltage, a control electrode configured to receive the first voltage, an active part, and an output electrode coupled to an output node from which the control voltage is output; a second voltage generating thin film transistor including an input electrode configured to receive a second voltage having a level greater than that of the first voltage, a control electrode configured to receive the second voltage, an active part, and an output electrode; and a resistor coupled to the output electrode of the second voltage generating thin film transistor and the output node.

In one embodiment, the display panel includes a plurality of gate lines configured to apply the gate signals to the pixels, and the first voltage has a substantially same level as that of an off voltage that discharges the gate lines.

In one embodiment, the second voltage has a substantially same level as that of a common voltage applied to the pixels.

In one embodiment, each of the thin film transistor and the voltage generating thin film transistor has a back channel etch (BCE) structure, and the active part of the voltage generating thin film transistor has a substantially same shape as that of the active part of the thin film transistor.

In one embodiment, each of the thin film transistor and the voltage generating thin film transistor is an NMOS thin film transistor.

In one embodiment, each of the active part of the voltage generating thin film transistor and the active part of the thin film transistor includes a semiconductor layer and an ohmic contact layer, and the semiconductor layer includes a metal oxide semiconductor.

In one embodiment, the driving stages are coupled to each other one after another and sequentially output the gate signals.

In one embodiment, the one driving stage includes a clock terminal configured to receive a clock signal and an output terminal configured to output a corresponding gate signal of the gate signals, and the thin film transistor is configured to receive the clock signal and to output the corresponding gate signal.

In one embodiment, the one driving stage includes: a first output configured to receive a clock signal and to output a corresponding gate signal of the gate signals; a second output configured to output a carry signal; a controller configured to control an on/off operation of the first and second outputs; a holder configured to hold an output terminal of the first output at an off voltage during an off period of the first output; a stabilizer configured to reduce rippling of the gate signal and the carry signal due to the clock signal; and a reducer configured to reduce the output terminal of the first output to the off voltage during the off period of the first output, wherein each of the first output, the second output, the controller, the holder, the stabilizer, and the reducer is included in the thin film transistor.

According to another embodiment of the present invention, there is provided a display device including: a display panel including a plurality of gate lines, a plurality of data lines insulated from the gate lines and crossing the gate lines, and a plurality of pixels, each of the pixels being coupled to a corresponding gate line of the gate lines and a corresponding data line of the data lines; a data driving circuit configured to apply data signals to the data lines; and a gate driving circuit including a plurality of driving stages configured to apply gate signals to the gate lines, one driving stage of the driving stages including: a thin film transistor including a first control electrode, an active part overlapping the first control electrode, an input electrode overlapping the active part, an output electrode overlapping the active part, and a second control electrode on the first control electrode and the active part; and a control voltage generator configured to supply a control voltage determined according to a channel characteristic of the thin film transistor to the second control electrode and to include a voltage generating thin film transistor including an active part having a same channel characteristic as the active part of the thin film transistor.

In one embodiment, each of the pixels includes: a pixel thin film transistor coupled to the corresponding gate line and the corresponding data line; and a liquid crystal capacitor including a first electrode electrically coupled to the pixel thin film transistor and a second electrode facing the first electrode such that a liquid crystal layer is between the first and second electrodes.

In one embodiment, the pixel thin film transistor includes a control electrode, an active part overlapping the control electrode, an input electrode overlapping the active part, and an output electrode overlapping the active part, the control electrode of the pixel thin film transistor is on a same layer as that of the first control electrode of the thin film transistor, and the active part of the pixel thin film transistor is on a same layer as that of the active part of the thin film transistor.

In one embodiment, the control voltage generator includes: a first voltage generating thin film transistor including an input electrode configured to receive a first voltage, a control electrode configured to receive the first voltage, an active part, and an output electrode coupled to an output node from which the control voltage is output; a second voltage generating thin film transistor including an input electrode configured to receive a second voltage having a level greater than that of the first voltage, a control electrode configured to receive the second voltage, an active part, and an output electrode; and a resistor coupled to the output electrode of the second voltage generating thin film transistor and the output node.

In one embodiment, the first voltage has a substantially same level as that of an off voltage that discharges the corresponding gate line.

In one embodiment, the second voltage has a substantially same level as that of a common voltage applied to the second electrode of the liquid crystal capacitor.

In one embodiment, each of the thin film transistor, the voltage generating thin film transistor, and the pixel thin film transistor has a back channel etch (BCE) structure, and the active part of the voltage generating thin film transistor has a substantially same shape as that of the active part of the thin film transistor and that of the active part of the pixel thin film transistor.

In one embodiment, each of the active part of the voltage generating thin film transistor, the active part of the thin film transistor, and the active part of the pixel thin film transistor includes a semiconductor layer and an ohmic contact layer, and the semiconductor layer includes a metal oxide semiconductor.

In one embodiment, the one driving stage includes a clock terminal configured to receive a clock signal and an output terminal configured to output a corresponding gate signal of the gate signals, and the thin film transistor is configured to receive the clock signal and to output the corresponding gate signal.

In one embodiment, the one driving stage includes: a first output configured to receive a clock signal and to output a corresponding gate signal of the gate signals; a second output configured to output a carry signal; a controller configured to control an on/off operation of the first and second outputs; a holder configured to hold an output terminal of the first output at an off voltage during an off period of the first output; a stabilizer configured to reduce rippling of the gate signal and the carry signal due to the clock signal; and a reducer configured to reduce the output terminal of the first output to the off voltage during the off period of the first output, each of the first output, the second output, the controller, the holder, the stabilizer, and the reducer is included in the thin film transistor.

According to the above and embodiments of the inventive concept, the thin film transistor may have a channel characteristic different from a designed channel characteristic due to a manufacturing process error thereof. The control voltage generator generates the control voltage determined by taking the channel characteristic of the thin film transistor into consideration.

The threshold voltage of the thin film transistor is controlled to be similar to a threshold voltage corresponding to the designed channel characteristic by the control voltage applied to the second control electrode. Therefore, the thin film transistor may be stabilized regardless of the manufacturing process error. Since the threshold voltage of the thin film transistor is controlled, the leakage current of the thin film transistor is reduced. Thus, the driving stage may output the gate signal having a set level (e.g., a predetermined level) or more.

When the gate signal having the set level (e.g., the predetermined level) is applied to the thin film transistor of the pixel, the pixels may be charged with the pixel voltage corresponding to the data signal. Accordingly, the horizontal line may be reduced (e.g., prevented from being displayed) on the display device. In addition, when the leakage current is reduced, the power consumption of the display device is reduced.

The control voltage generator generates the control voltage using the common voltage applied to the pixel and the off voltage applied to the driving stage. Therefore, the display device may generate the control voltage without generating a separate voltage.

BRIEF DESCRIPTION OF THE DRAWINGS

The above and other aspects of embodiments of the present disclosure will become readily apparent by reference to the following detailed description when considered in conjunction with the accompanying drawings wherein.

DETAILED DESCRIPTION

Figure 1:
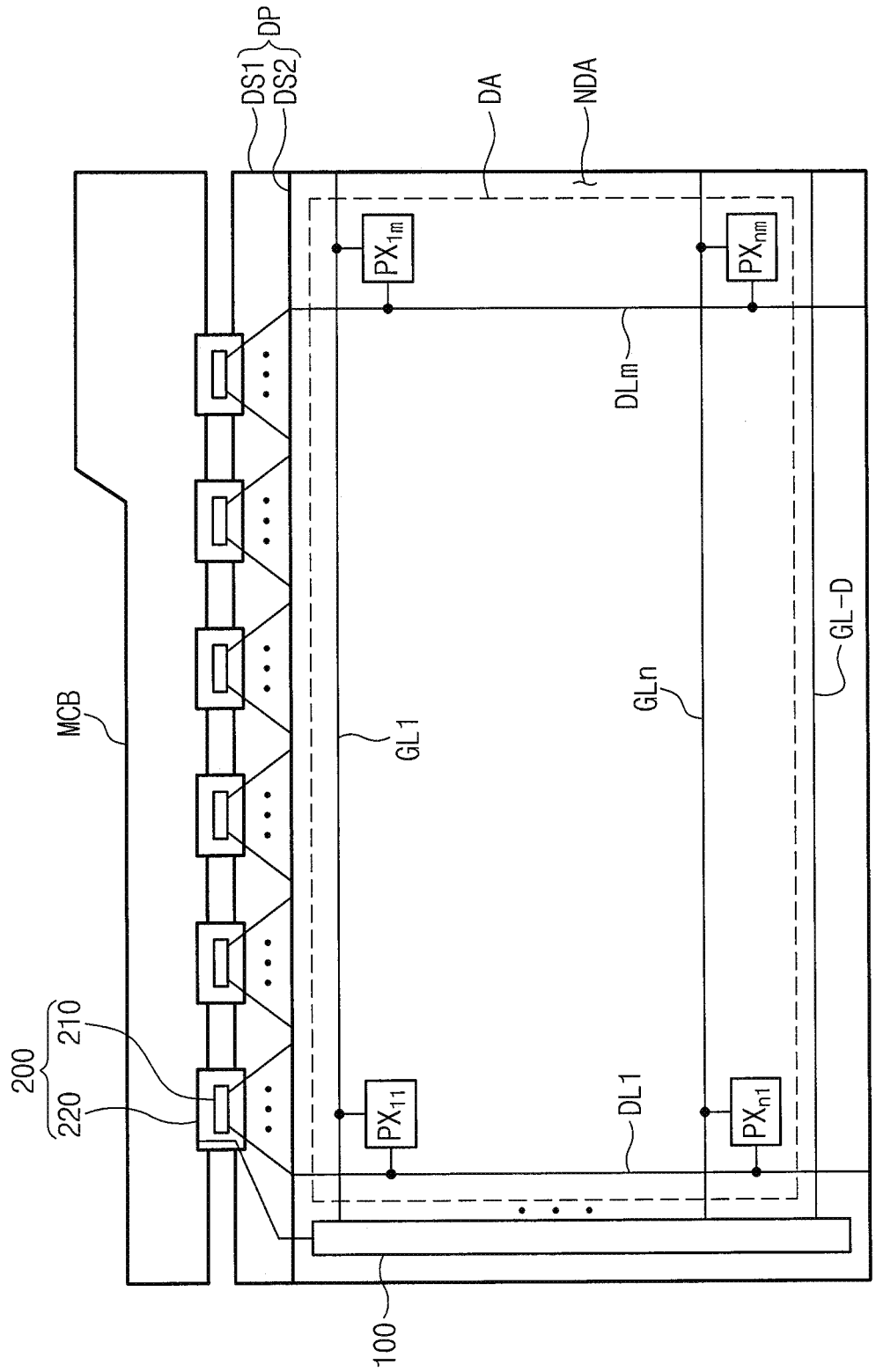
FIG. 1 is a plan view showing a display device according to an example embodiment of the present disclosure.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used (or utilized) to distinguish one element, component, region, layer or section from another region, layer or section. Thus, a first element, component, region, layer or section discussed below could be termed a second element, component, region, layer or section without departing from the teachings of embodiments of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, components, and/or groups but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

FIG. 1 is a plan view showing a display device according to an example embodiment of the present disclosure.

Referring to FIG. 1, the display device includes a display panel DP, a gate driving circuit (or gate driver) 100, and a data driving circuit (or data driver) 200.

The display panel DP may be various display panels, such as a liquid crystal display panel, an organic light emitting display panel, an electrophoretic display panel, an electrowetting display panel, etc. In the present example embodiment, the liquid crystal display panel will be described as the display panel DP. The liquid crystal display device including the liquid crystal display panel further includes a polarizer and a backlight unit.

The display panel DP includes a first substrate DS1, a second substrate DS2 spaced apart from the first substrate DS1, and a liquid crystal layer between the first and second substrates DS1 and DS2. The display panel DP includes a display area DA (in which a plurality of pixels PX11 to PXnm are disposed and a non-display area NDA surrounding the display area DA. FIG. 1 shows a portion of the pixels PX11 to PXnm.

The display panel DP includes a plurality of gate lines GL1 to GLn and a plurality of data lines DL1 to DLm crossing the gate lines GL1 to GLn, which are on the first base substrate DS1. Each of the pixels PX11 to PXnm is coupled (e.g., connected) to a corresponding gate line of the gate lines GL1 to GLn and a corresponding data line of the data lines DL1 to DLm. FIG. 1 shows a portion of the gate lines GL1 to GLn and a portion of the data lines DL1 to DLm.

In addition, the display panel DP further includes a dummy gate line GL-D on the first substrate DS1. The dummy gate line GL-D is not coupled (e.g., connected) to the pixels PX11 to PXnm and is in the non-display area NDA.

The gate lines GL1 to GLn are coupled to the gate driving circuit 100. The gate driving circuit 100 sequentially applies gate signals to the gate lines GL1 to GLn. The gate driving circuit 100 is concurrently (or simultaneously) formed with the pixels PX11 to PXnm through a thin film process. For instance, the gate driving circuit 100 may be mounted in the non-display area NDA in an ASG (amorphous silicon TFT gate driver circuit) form.

FIG. 1 shows one gate driving circuit 100 coupled to left ends of the gate lines GL1 to GLn as a representative example. In the present example embodiment, the display device may include two gate driving circuits. Among the two gate driving circuits, one gate driving circuit is coupled to left ends of the gate lines GL1 to GLn and the other gate driving circuit is coupled to right ends of the gate lines GL1 to GLn. In addition, among the two gate driving circuits, one gate driving circuit is coupled to odd-numbered gate lines of the gate lines gL1 to GLn and the other gate driving circuit is coupled to even-numbered gate lines of the gate lines GL1 to GLn.

The data driving circuit 200 receives image data from a timing controller mounted on a main circuit board MCB. The data driving circuit 200 generates analog data signals corresponding to the image data.

The data lines DL1 to DLm are coupled to the data driving circuit 200. The data lines DL1 to DLm receive the data signals output from the data driving circuit 200.

The data driving circuit 200 includes a driving chip 210 and a flexible circuit board 220 on which the driving chip 210 is mounted. Each of the driving chip 210 and the flexible circuit board 220 is provided as more than one (e.g., in a plural number). The flexible circuit boards 220 electrically couple the main circuit board MCB and the first substrate DS1. Each of the driving chips 210 applies the data signals to corresponding data lines of the data lines DL1 to DLm.

FIG. 1 shows the data driving circuit 200 in a tape carrier package (TCP) form, but it should not be limited thereto or thereby. That is, the data driving circuit 200 may be in the non-display area NDA of the first substrate DS1 in a chip on glass (COG) form.

Figure 2:
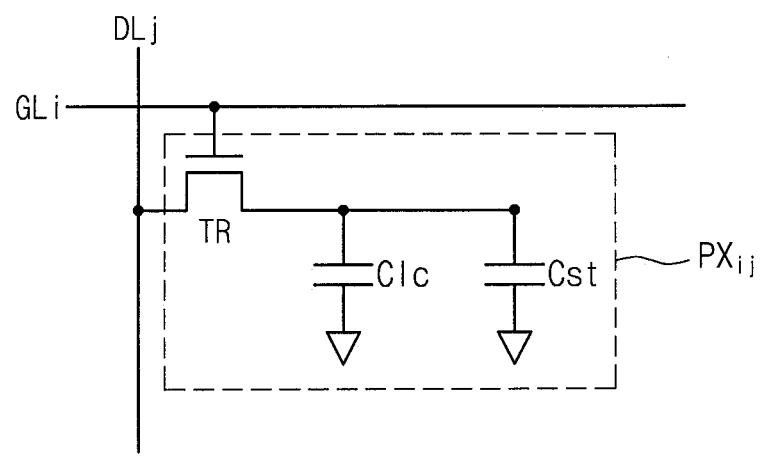
FIG. 2 is an equivalent circuit diagram showing a pixel according to an example embodiment of the present disclosure.

FIG. 2 is an equivalent circuit diagram showing a pixel PXij according to an example embodiment of the present disclosure. Each of the pixels PX11 to PXnm may have the equivalent circuit diagram shown in FIG. 2.

Referring to FIG. 2, the pixel PXij includes a pixel thin film transistor TR (hereinafter, referred to as a pixel transistor), a liquid crystal capacitor Clc, and a storage capacitor Cst. In the present example embodiment, the term of "transistor" used herein refers to the thin film transistor.

The pixel transistor TR is electrically coupled to an i-th gate line GLi and a j-th data line DLj. The pixel transistor TR outputs a pixel voltage corresponding to the data signal provided through the j-th data line DLj in response to the gate signal provided through the i-th gate line.

The liquid crystal capacitor Clc is charged with the pixel voltage output from the pixel transistor TR. An arrangement of liquid crystal directors included in the liquid crystal layer LCL (refer to FIG. 3) is changed depending on an amount of electric charges charged in the liquid crystal capacitor Clc. The liquid crystal layer transmits or blocks a light incident thereto in accordance with the arrangement of the liquid crystal directors.

The storage capacitor Cst is coupled to the liquid crystal capacitor Clc in parallel. The storage capacitor Cst maintains the arrangement of the liquid crystal directors for a certain time period (e.g., a predetermined time period).

Figure 3:
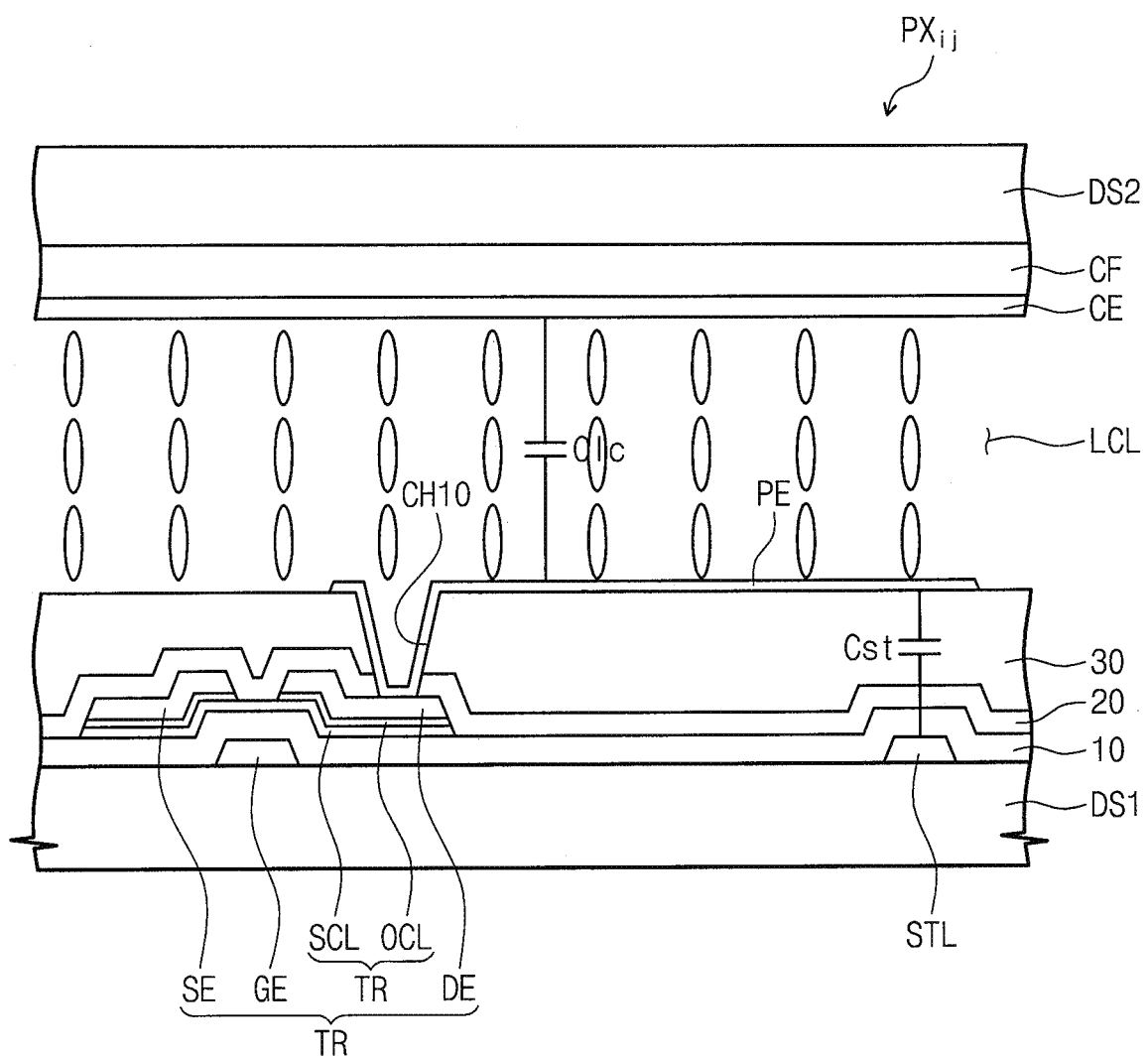
FIG. 3 is a cross-sectional view showing a pixel according to an example embodiment of the present disclosure.

FIG. 3 is a cross-sectional view showing the pixel PXij according to an example embodiment of the present disclosure.

Referring to FIG. 3, the pixel transistor TR includes a control electrode (or gate electrode) GE coupled to the i-th gate line GLi (refer to FIG. 2), an active part AL overlapped with the control electrode GE, an input electrode (or source electrode) SE coupled to the j-th data line DLj (refer to FIG. 2), and an output electrode (or drain electrode) DE disposed to be spaced apart from the input electrode SE.

The liquid crystal capacitor Clc includes a pixel electrode PE and a common electrode CE. The storage capacitor Cst includes the pixel electrode PE and a portion of a storage line STL, which is overlapped with the pixel electrode PE.

The i-th gate line GLi and the storage line STL are on a surface of the first substrate DS1. The control electrode GE is branched from the i-th gate line GLi. The i-th gate line GLi and the storage line STL may include a metal material, e.g., aluminum (Al), silver (Ag), copper (Cu), molybdenum (Mo), chromium (Cr), tantalum (Ta), titanium (Ti), etc., or an alloy thereof. Each of the i-th gate line GLi and the storage line STL may have a multi-layer structure of a titanium layer and a copper layer.

A first insulating layer 10 is on the surface of the first substrate DS1 to cover the control electrode GE and the storage line STL. The first insulating layer 10 includes at least one of an inorganic material and an organic material. The first insulating layer 10, may be an organic or inorganic layer. The first insulating layer 10 has a multi-layer structure of a silicon nitride layer and a silicon oxide layer.

The active part AL is on the first insulating layer 10 to overlap with the control electrode GE. The active part AL includes a semiconductor layer SCL and an ohmic contact layer OCL. The semiconductor layer SCL is on the first insulating layer 10 and the ohmic contact layer OCL is on the semiconductor layer SCL.

The semiconductor layer SCL includes amorphous silicon or poly silicon. In addition, the semiconductor layer SCL includes a metal oxide semiconductor layer. The ohmic contact layer OCL is doped with a dopant at a higher concentration than that of the semiconductor layer. The ohmic contact layer OCL includes two portions separated from each other. In the present example embodiment, the ohmic contact layer OCL may be integrally formed as a single unitary and individual unit.

The output electrode DE and the input electrode SE are on the active part AL. The output electrode DE and the input electrode SE are spaced apart from each other. Each of the output electrode DE and the input electrode SE is partially overlapped with the control electrode GE.

In more detail, the output electrode DE and the input electrode SE are on the ohmic contact layer OCL. When viewed in a plan view, the output electrode DE is completely overlapped with one portion of the ohmic contact layer OCL and the input electrode SE is completely overlapped with the other portion of the ohmic contact layer OCL.

A second insulating layer 20 is on the first insulating layer 10 to cover the active part AL, the output electrode DE, and the input electrode SE. The second insulating layer 20 includes at least one of an inorganic material and an organic material. The second insulating layer 20 may be an organic layer or an inorganic layer. The second insulating layer 20 may have a multi-layer structure of a silicon nitride layer and a silicon oxide layer.

FIG. 1 shows the pixel transistor TR having a staggered structure, but the structure of the pixel transistor TR should not be limited to the staggered structure. For instance, the thin film transistor TR may have a planar structure.

A third insulating layer 30 is on the second insulating layer 20. The third insulating layer 30 provides a planarized surface. The third insulating layer 30 may include an organic material.

The pixel electrode PE is on the third insulating layer 30. The pixel electrode PE is coupled to the output electrode DE through a contact hole CH10 formed through the second insulating layer 20 and the third insulating layer 30. An alignment layer may be further on the third insulating layer 30 to cover the pixel electrode PE.

A color filter layer CF is on a surface of the second substrate DS2. The common electrode CE is on the color filter layer CF. The common electrode CE is supplied (e.g., applied) with a common voltage. The common voltage has a value different from that of the pixel voltage. An alignment layer may be further on the common electrode CE to cover the common electrode CE. Another insulating layer may be between the color filter layer CF and the common electrode CE.

The pixel electrode PE, the common electrode CE, and the liquid crystal layer LCL between the pixel electrode PE and the common electrode CE form the liquid crystal capacitor Clc. In addition, the pixel electrode PE, the portion of the storage line STL, and the first, second, and third insulating layers 10, 20, and 30 between the pixel electrode PE and the portion of the storage line STL form the storage capacitor Cst. The storage line STL receives a storage voltage having a value different from that of the pixel voltage. The storage voltage may have the same value as that of the common voltage.

Different from the structure shown in FIG. 3, at least one of the color filter layer CF and the common electrode CE may be on the first substrate DS1. In other words, the liquid crystal display panel according to the present example embodiment may include a pixel operated in a vertical alignment (VA) mode, a patterned vertical alignment (PVA) mode, an in-plane switching (IPS) mode, a fringe-field switching (FFS) mode, or a plane to line switching (PLS) mode.

Figure 4:
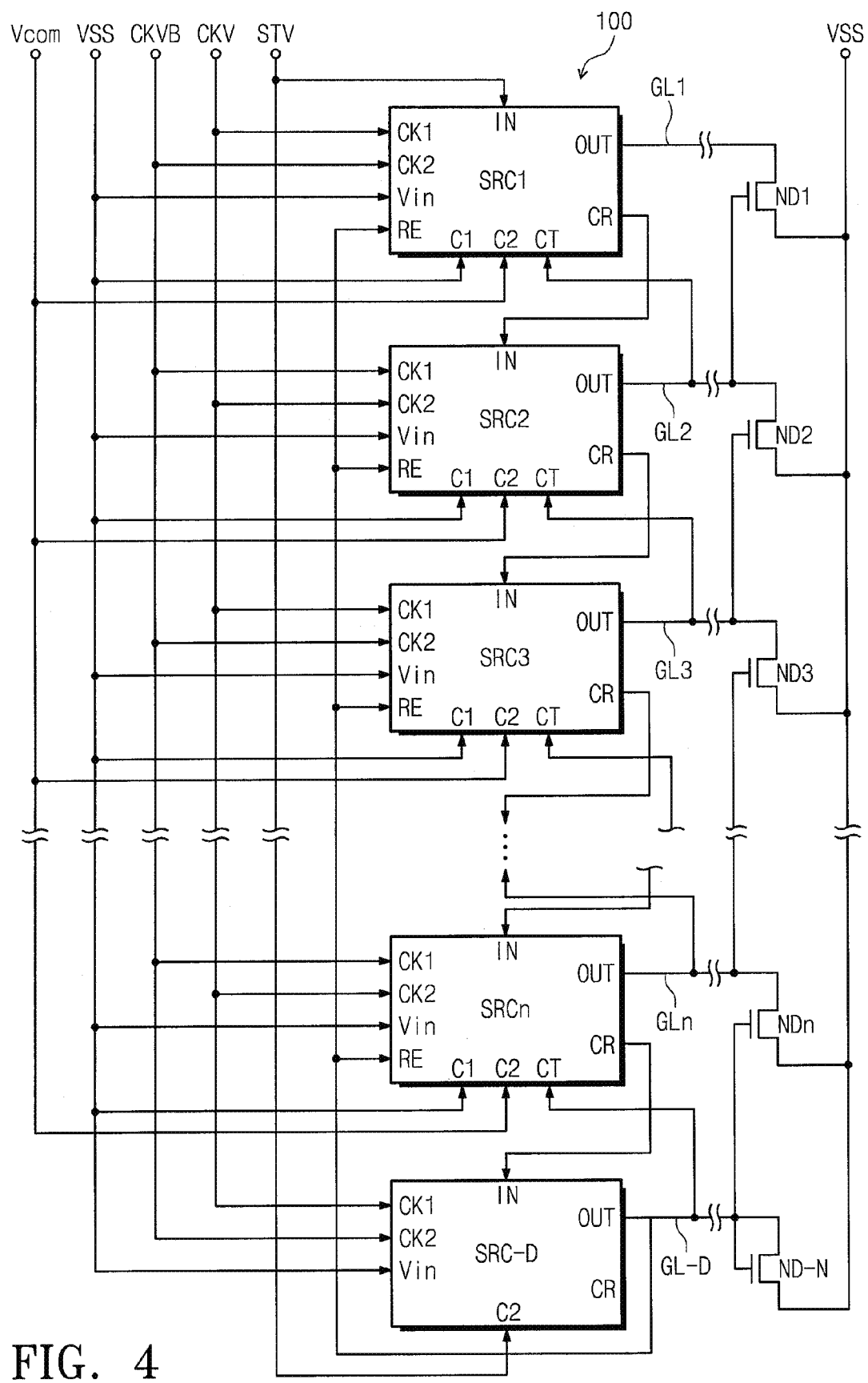
FIG. 4 is a block diagram showing a gate driving circuit according to an example embodiment of the present disclosure.

FIG. 4 is a block diagram showing the gate driving circuit 100 according to an example embodiment of the present disclosure.

Referring to FIG. 4, the gate driving circuit 100 includes a plurality of driving stages SRC1 to SRCn coupled to each other, one after another.

The driving stages SRC1 to SRCn are coupled to the gate lines GL1 to GLn, respectively. That is, the driving stages SRC1 to SRCn apply the gate signals to the gate lines GL1 to GLn, respectively.

The gate driving circuit 100 further includes a dummy stage SRC-D coupled to the last driving stage SRCn among the driving stages SRC1 to SRCn. The dummy stage SRC-D is coupled to the dummy gate line GL-D.

Each of the driving stages SRC1 to SRCn includes an output terminal OUT, an input terminal IN, a carry terminal CR, a control terminal CT, a reset terminal RE, a first clock terminal CK1, a second clock terminal CK2, an off voltage input terminal Vin, a first voltage input terminal C1, and a second voltage input terminal C2.

The output terminal OUT of each of the driving stages SRC1 to SRCn is coupled to the corresponding gate line of the gate lines GL1 to GLn. The gate signals generated by the driving stages SRC1 to SRCn are applied to the gate lines GL1 to GLn through the output terminals OUT.

The carry terminal CR of each of the driving stages SRC1 to SRCn is electrically coupled to the input terminal IN of a next driving stage. The input terminal IN of each of the driving stages SRC1 to SRCn receives a carry signal from a previous driving stage. For instance, the input terminal IN of a third driving stage SRC3 receives the carry signal from a second driving stage SRC2. Among the driving stages SRC1 to SRCn, the input terminal IN of a first driving stage SRC1 receives a start signal STV to start an operation of the gate driving signal 100 instead of the carry signal of the previous driving stage.

The control terminal CT of each of the driving stages SRC1 to SRCn is electrically coupled to the output terminal OUT of the next driving stage. The control terminal CT of each of the driving stages SRC1 to SRCn receives the gate signal from the next driving stage. For instance, the control terminal CT of the second driving stage SRC2 receives the gate signal output from the output terminal OUT of the third driving stage SRC3.

The control terminal CT of the last driving stage SRCn receives the gate signal output from the output terminal OUT of the dummy stage SRC-D. The control terminal CT of the dummy stage SRC-D receives the start signal STV.

The reset terminal RE of each of the driving stages SRC1 to SRCn receives the gate signal output from the output terminal OUT of the dummy stage SRC-D.

Each of the first and second clock terminals CK1 and CK2 of each of the driving stages SRC1 to SRCn receives one of first and second clock signals CKV and CKVB. Among the driving stages SRC1 to SRCn, the first and second clock terminals CK1 and CK2 of each of odd-numbered driving stages (e.g., SRC1 and SRC3) respectively receive the first and second clock signals CKV and CKVB. Among the driving stages SRC1 to SRCn, the first and second clock terminals CK1 and CK2 of each of even-numbered driving stages (e.g., SRC2 and SRCn) respectively receive the second and first clock signals CKVB and CKV.

The off voltage input terminal Vin of each of the driving stages SRC1 to SRCn receives an off voltage VSS. The first voltage input terminal C1 of each of the driving stages SRC1 to SRCn receives the off voltage VSS. The second voltage input terminal C2 of each of the driving stages SRC1 to SRCn receives a common voltage Vcom The off voltage VSS may be a negative voltage. As an example, the off voltage VSS has a level of from about −7 volts to about −12 volts. The common voltage Vcom may be a ground voltage or a positive voltage. As an example, the common voltage Vcom has a level of about +7 volts.

Each of discharge transistors ND1 to NDn is coupled to the right end of the corresponding gate line of the gate lines GL1 to GLn. Each of the discharge transistors ND1 to NDn includes a control electrode coupled to a next gate line of the corresponding gate line, an input electrode supplied (e.g., applied) with the off voltage VSS, and an output electrode supplied (e.g., applied) with the corresponding gate line. Each of the discharge transistors ND1 to NDn discharges the corresponding gate line to the off voltage VSS in response to the gate signal applied to the next gate line.

A dummy discharge transistor ND-D is coupled to the right end of the dummy gate line GL-D. The dummy discharge transistor ND-D discharges the dummy gate line to the off voltage VSS in response to a dummy gate signal.

According to the circuit configuration of the driving stages SRC1 to SRCn, each of the driving stages SRC1 to SRCn further includes other terminals, and one of the output terminal OUT, the input terminal IN, the carry terminal CR, the control terminal CT, the reset terminal RE, the first clock terminal CK1, the second clock terminal CK2, and the off voltage input terminal Vin may be omitted in each of the driving stages SRC1 to SRCn. In addition, the connection relation between the driving stages SRC1 to SRCn may be changed.

Figure 5:
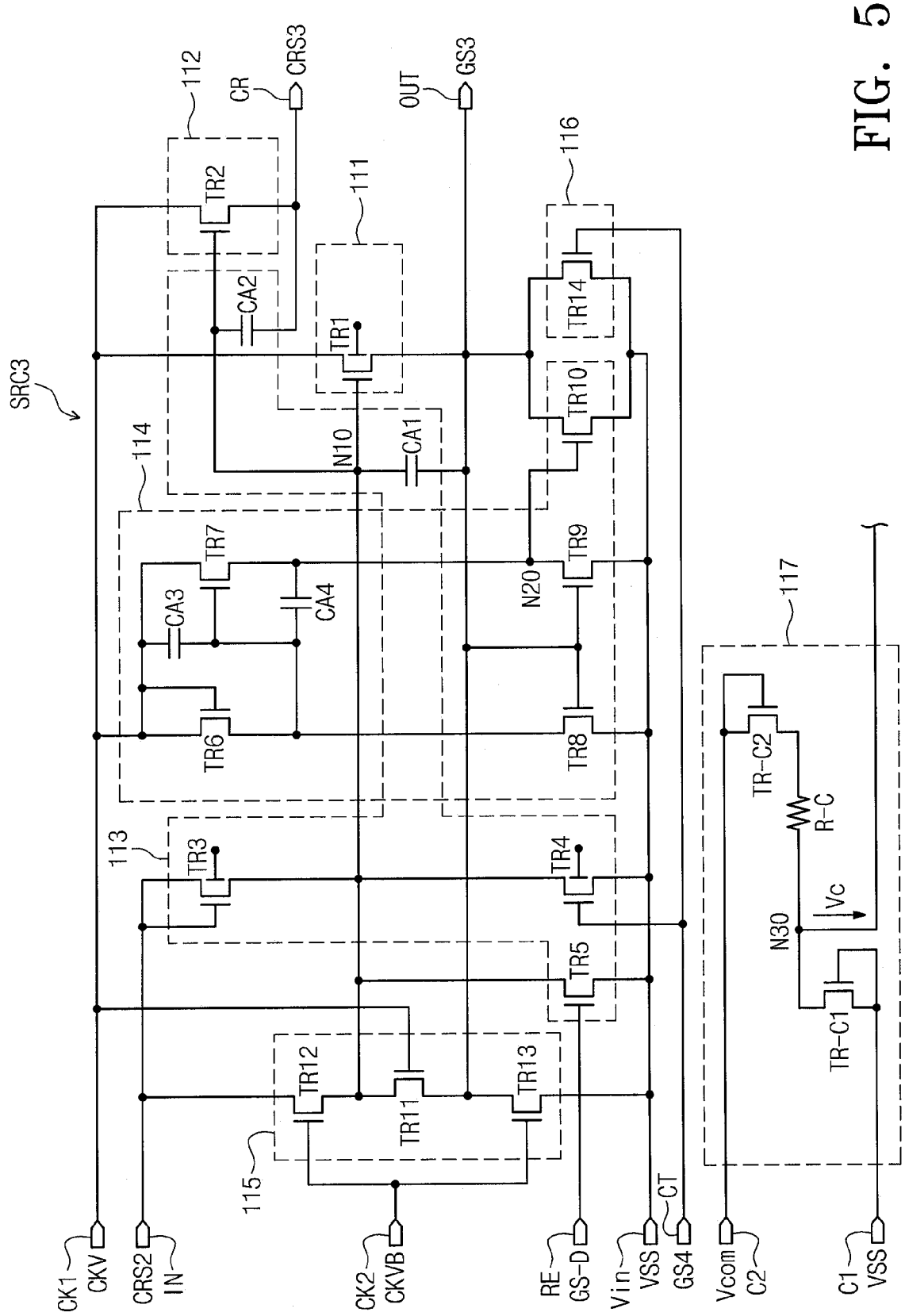
FIG. 5 is a circuit diagram showing one driving stage of driving stages shown in FIG. 4.
Figure 6:
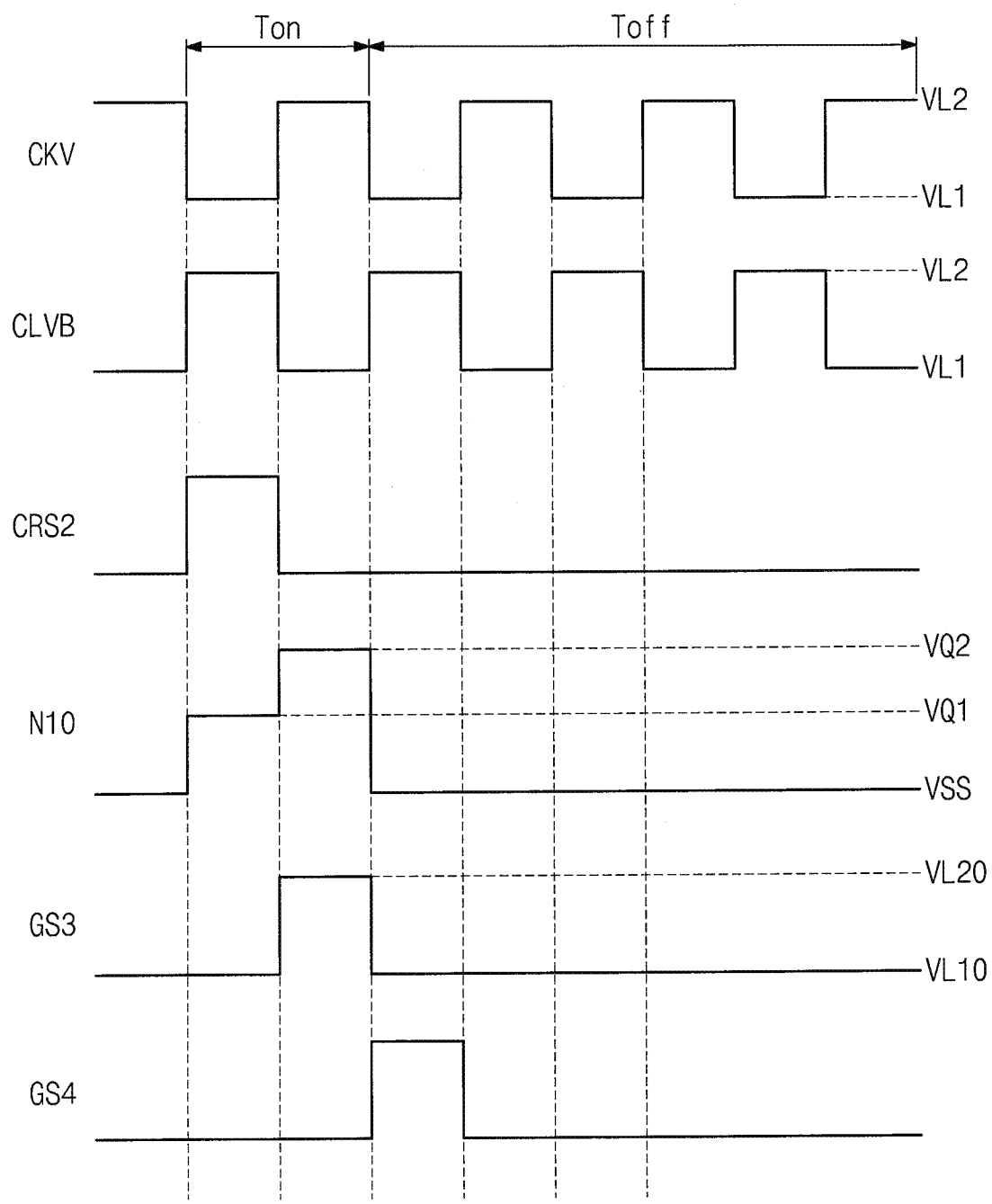
FIG. 6 is a waveform diagram showing input and output signals of the driving stage shown in FIG. 5.

FIG. 5 is a circuit diagram showing one driving stage of the driving stages SRC1 to SRCn shown in FIG. 4 and FIG. 6 is a waveform diagram showing input and output signals of the driving stage shown in FIG. 5. FIG. 5 shows the third driving stage SRC3 among the driving stages SRC1 to SRCn shown in FIG. 4. Each driving stage SRC1 to SRCn shown in FIG. 4 may have the same circuit diagram as that of the third driving stage SRC3 shown in FIG. 5.

Referring to FIG. 5, the third driving stage SRC3 includes a first output part (or a first output) 111, a second output part (or a second output) 112, a control part (or a controller) 113, a holding part (or a holder) 114, a stabilizing part (or a stabilizer) 115, a pull-down part (or a reducer) 116, and a control voltage generating part (or a control voltage generator) 117, but it should not be limited thereto or thereby.

The first output part 111 outputs the gate signal GS3 to the third gate line GL3 (refer to FIG. 4), and the second output part 112 applies the carry signal CRS3 to a fourth driving stage.

The control part 113 controls operations of the first and second output parts 111 and 112. The control part 113 turns on the first and second output parts 111 and 112 in response to the carry signal CRS2 output from the second driving stage SRC2. The control part 113 turns off the first and second output parts 111 and 112 in response to the gate signal GS4 output from the fourth driving stage SRC4.

The holding part 114 holds an electric potential of the output terminal OUT at the off voltage VSS during an off period Toff (refer to FIG. 6) of the first output part 111. The stabilizing part 115 reduces (e.g., prevents) rippling of the gate signal GS3 output from the first output part 111 and the carry signal CRS3 output from the second output part 112 by the first clock signal CKV or the second clock signal CKVB.

The pull-down part 116 reduces (e.g., pulls down) the electric potential of the output terminal OUT to the off voltage VSS in response to the gate signal GS4 of the fourth driving stage SRC4. The pull-down part 116 may be omitted in other embodiments of the present invention.

The control voltage generating part 117 receives the off voltage VSS and the common voltage Vcom. The control voltage generating part 117 generates a control voltage Vc applied to a transistor including two control electrodes. The display device may generate the control voltage Vc using the voltage applied to the common electrode CE (refer to FIG. 3) and the voltage applied to the off voltage input terminal Vin without changing a separate source voltage.

The control voltage Vc controls a threshold voltage of the transistor including the two control electrodes. At least one of the first output part 111, the second output part 112, the control part 113, the holding part 114, the stabilizing part 115, and the pull-down part 116 may include the transistor including the two control electrodes.

As shown in FIG. 5, the first output part 111 and the control part 113 may include the transistor including the two control electrodes. The third driving stage SRC3 shown in FIG. 5 is provided as a representative example. Hereinafter, the third driving stage SRC3 will be described in more detail with reference to FIGS. 5 and 6.

The first output part 111 includes a first output transistor TR1. The first output transistor TR1 includes an input electrode (or a source electrode) applied with the first clock signal CKV, a first control electrode (or a first gate electrode) coupled to the control part 113, and an output electrode (or a drain electrode) that outputs the gate signal GS3. The output electrode of the first output transistor TR1 serves as the output terminal of the first output part 111. The first control electrode of the first output transistor TR1 is coupled to a first node N10 corresponding to an output terminal of the control part 113. The first output transistor TR1 further includes a second control electrode applied with the control voltage Vc.

The second output part 112 includes a second output transistor TR2. The second output transistor TR2 includes an input electrode applied with the first clock signal CKV, a control electrode coupled to the control electrode of the first output transistor TR1, and an output electrode that outputs the carry signal CRS3.

The first clock signal CKV and the second clock signal CKVB have opposite phases to each other. The first and second clock signals CKV and CKVB have a phase difference of about 180 degrees. Each of the first and second clock signals CKV and CKVB includes low periods having a relatively low level and high periods having a relatively high level. The low periods are alternately repeated with the high periods in each of the first and second clock signals CKV and CKVB.

Each of the first and second clock signals CKV and CKVB has a first level VL1 during the low periods. The first level VL1 may be substantially the same as the off voltage VSS. Each of the first and second clock signals CKV and CKVB has a second level VL2 higher than that of the first level VL1 during the high periods.

The control part 113 includes a first control transistor TR3, a second control transistor TR4, a third control transistor TR5, a first capacitor CA1, and a second capacitor CA2.

The first control transistor TR3 includes a first control electrode and an input electrode, which commonly receive the carry signal CRS2 of the second driving stage SRC2. The first control transistor TR3 includes an output electrode coupled to the first node N10. The second control transistor TR4 includes an output electrode coupled to the first node N10, a first control electrode applied with the gate signal GS4 of the fourth driving stage, and an input electrode applied with the off voltage VSS. Each of the first and second control transistors TR3 and TR4 includes a second control electrode applied with the control voltage Vc.

The third control transistor TR5 includes a control electrode coupled to the reset terminal RE, an input electrode coupled to the off voltage input terminal Vin, and an output electrode coupled to the first node N10.

A first electrode of the first capacitor CA1 is coupled to the control electrode of the first output transistor TR1, and a second electrode of the first capacitor CA1 is coupled to the output electrode of the first output transistor TR1. A first electrode of the second capacitor CA2 is coupled to the control electrode of the second output transistor TR2, and a second electrode of the second capacitor CA2 is coupled to the output electrode of the second output transistor TR2.

When the first control transistor TR3 is turned on during the high period of the carry signal CRS2 of the second driving stage SRC2, an electric potential of the first node N10 rises up to a first high voltage VQ1, and the first and second output transistors TR1 and TR2 are turned on.

When the electric potential of the first node N10 rises up to the first high voltage VQ1, the first capacitor CA1 is charged with a voltage corresponding to the first high voltage VQ1. Then, the first output transistor TR1 is bootstrapped. Accordingly, the first node N10 is boosted to a second high voltage VQ2 from the first high voltage VQ1. When the first node N10 is boosted to the second high voltage VQ2, the first output transistor TR1 outputs the gate signal GS3.

The gate signal GS3 has a first level VL10 during the low period and has a second level VL20 higher than the first level VL10 during the high period. The first level VL10 may have the same value as that of the off voltage VSS.

A period in which the first output transistor TR1 is turned on (i.e., a period in which the first node N10 has the first high voltage VQ1 or the second high voltage VQ2) corresponds to an ON period Ton of the first output part 111. A period following the ON period Ton of the first output part 111 corresponds to an OFF period Toff of the first output part 111.

When the second control transistor TR4 is turned on during the high period of the gate signal GS4 output from the fourth driving stage, the electric potential of the first node N10 is reduced (e.g., falls down) to the off voltage VSS. When the electric potential of the first node N10 is reduced (e.g., falls down), the first and second output transistors TR1 and TR2 are turned off.

The third control transistor TR5 is turned on in response to the gate signal GS-D of the dummy stage SRC-D. When the third control transistor TR5 is turned on, the electric potential of the first node N10 is reset to have the off voltage VSS.

The holding part 114 includes first, second, third, fourth, and fifth inverter transistors TR6, TR7, TR8, TR9, and TR10, and third and fourth capacitors CA3 and CA4. The first inverter transistor TR6 includes an input electrode and a control electrode, which are commonly coupled to the first clock terminal CK1, and an output electrode coupled to the fourth capacitor CA4. The second inverter transistor TR7 includes an input electrode coupled to the first clock terminal CK1, a control electrode coupled to the third capacitor CA3, and an output electrode coupled to the fourth capacitor CA4.

The third capacitor CA3 includes a first electrode coupled to the input and control electrodes of the first inverter transistor TR6 and a second electrode coupled to the control electrode of the second inverter transistor TR7. The fourth capacitor CA4 includes a first electrode coupled to the first clock terminal CK1 and a second electrode coupled to the control electrode of the second inverter transistor TR7.

The third inverter transistor TR8 includes an input electrode coupled to the output electrode of the first inverter transistor TR6, a control electrode coupled to the output terminal OUT, and an output electrode coupled to the off voltage input terminal Vin. The fourth inverter transistor TR9 includes an input electrode coupled to the output electrode of the second inverter transistor TR7, a control electrode coupled to the output terminal OUT, and an output electrode coupled to the off voltage input terminal Vin.

The fifth inverter transistor TR10 includes a control electrode coupled to the input electrode of the fourth inverter transistor TR9, an output electrode coupled to the output terminal OUT, and an input electrode coupled to the off voltage input terminal Vin. The output electrode of the second inverter transistor TR7, the input electrode of the fourth inverter transistor TR9, and the control electrode of the fifth inverter transistor TR10 are coupled to a second node N20.

The third and fourth inverter transistors TR8 and TR9 are turned on in response to the gate signal GS3 output through the output terminal OUT. In this case, the first clock signal CKV output from the first and second inverter transistors TR6 and TR7 are discharged to the off voltage VSS. Accordingly, the fifth inverter transistor TR10 is maintained in a turn-off state during the high period of the gate signal GS3.

Then, when the gate signal GS3 is switched (e.g., transited) to the low level, the third and fourth inverter transistors TR8 and TR9 are turned off during the off period Toff of the first output part 111. The fifth inverter transistor TR10 is turned on in response to the high period of the first clock signal CKV output from the first and second inverter transistors TR6 and TR7 during the off period Toff of the first output part 111. When the fifth inverter transistor TR10 is turned on, the electric potential of the output terminal OUT is held to the off voltage VSS in the low period of the first clock signal CKV.

The stabilizing part 115 includes first, second, and third stabilizing transistors TR11, TR12, and TR13. The first stabilizing transistor TR11 includes a control electrode coupled to the first clock terminal CK1, an input electrode coupled to the output terminal OUT, and an output electrode coupled to the first node N10. The second stabilizing transistor TR12 includes a control electrode coupled to the second clock terminal CK2, an input electrode coupled to the input terminal IN, and an output electrode coupled to the first node N10. The third stabilizing transistor TR13 includes a control electrode coupled to the second clock terminal CK2, an output electrode coupled to the output terminal OUT, and an input electrode coupled to the off voltage input terminal Vin.

During the off period Toff of the first output part 111, the first stabilizing transistor TR11 is turned on for the high period of the first clock signal CKV. During the off period Toff of the first output part 111, the first stabilizing transistor TR11 electrically couples the output terminal OUT and the first node N10 in response to the first clock signal CKV. During the off period Toff of the first output part 111, the output terminal OUT is held to the off voltage VSS and the first node N10 electrically coupled to the output terminal OUT is held to the off voltage VSS.

During the off period Toff of the first output part 111, the second stabilizing transistor TR12 is turned on for the high period of the second clock signal CKVB. During the off period Toff of the first output part 111, the second stabilizing transistor TR12 electrically couples the input terminal IN and the first node N10 in response to the second clock signal CKVB. During the off period Toff of the first output part 111, the input terminal IN is held to the off voltage VSS and the first node N10 electrically coupled to the input terminal IN is held to the off voltage VSS.

During the off period Toff of the first output part 111, the third stabilizing transistor TR13 is turned on for the high period of the second clock signal CKVB. During the off period Toff of the first output part 111, the third stabilizing transistor TR13 holds the output terminal OUT to the off voltage VSS in response to the second clock signal CKVB.

The pull-down part 116 includes a pull-down transistor TR14. The pull-down transistor TR14 includes a control electrode coupled to the control terminal CT, an input electrode coupled to the off voltage input terminal Vin, and an output electrode coupled to the output terminal OUT. The pull-down transistor TR14 reduces (e.g., pulls down) the electric potential of the output terminal OUT to the off voltage VSS during the high period of the gate signal GS4 output from the fourth driving stage SRC4.

The control voltage generating part 117 includes a first voltage generating transistor TR-C1, a second voltage generating transistor TR-C2, and a resistor R-C. The control voltage generating part 117 includes an output node N30 to output the control voltage Vc.

The first voltage generating transistor TR-C1 includes an input electrode and a control electrode, which are commonly coupled to the first voltage input terminal C1, and an output electrode coupled to the output node N30. The second voltage generating transistor TR-C2 includes an input electrode and a control electrode, which are commonly coupled to the second voltage input terminal C2, and an output electrode coupled to one end of the resistor R-C. The resistor R-C couples the output electrode of the second voltage generating transistor TR-C2 and the output node N30.

In the present example embodiment, the input electrode and the control electrode of the first voltage generating transistor TR-C1 may be commonly coupled to the off voltage input terminal Vin. Therefore, the first voltage input terminal C1 may be omitted.

The control voltage generating part 117 generates the control voltage Vc in consideration of a channel characteristic of the first and second voltage generating transistors TR-C1 and TR-C2. The first and second voltage generating transistors TR-C1 and TR-C2 have substantially the same channel characteristic as that of the other transistors included in the third driving stage SRC3 (refer to FIG. 5).

Consequently, the control voltage Vc is determined by the channel characteristics of the transistors included in the first output part 111, the second output part 112, the control part 113, the holding part 114, the stabilizing part 115, the pull-down part 116, and the control voltage generating part 117.

Figure 7:
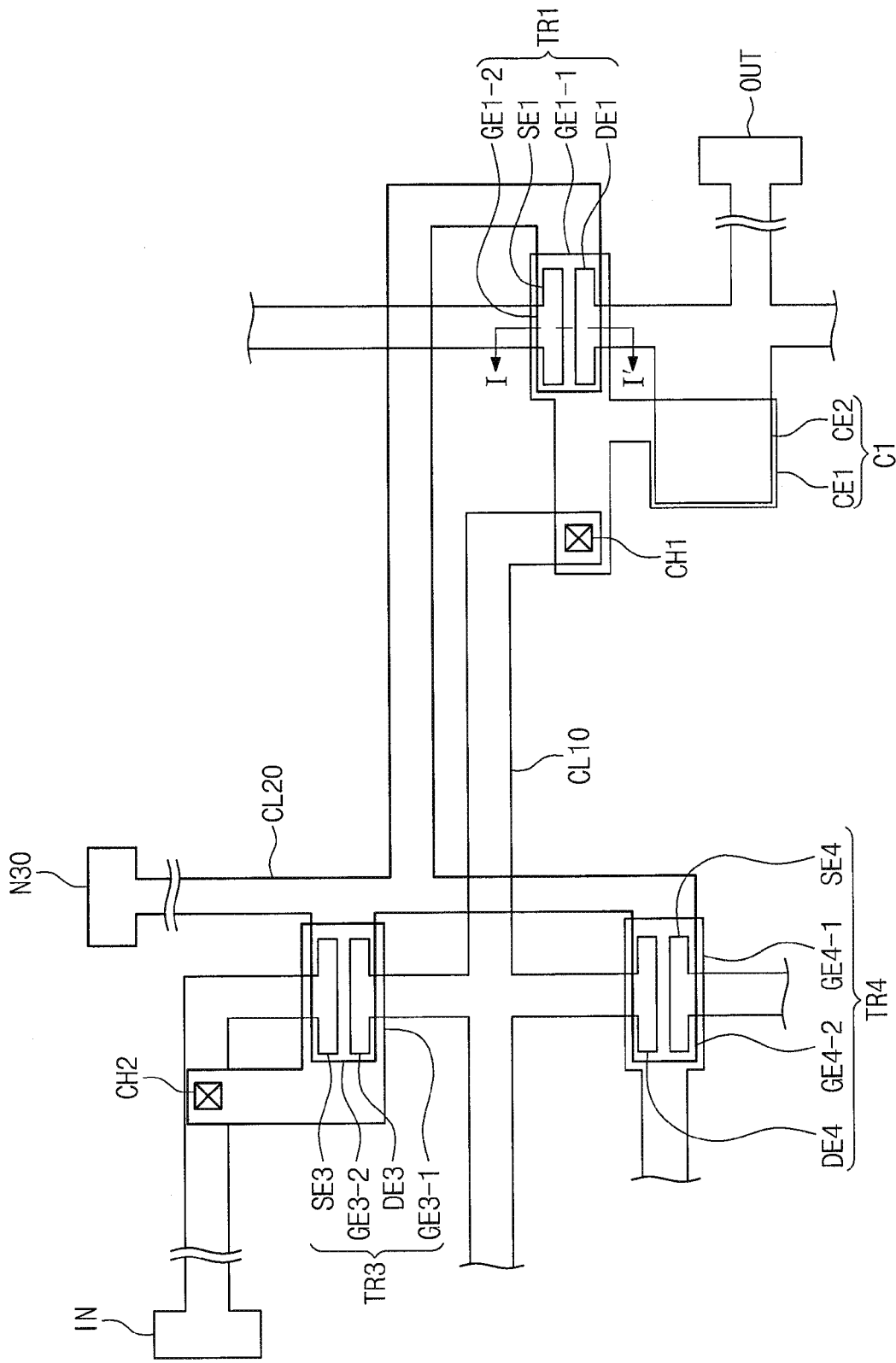
FIG. 7 is a layout diagram showing a portion of the driving stage shown in FIG. 5.

Hereinafter, the channel characteristics of the transistor will be described in more detail with reference to FIGS. 7 to 9. FIG. 7 is a layout diagram showing a portion of the driving stage shown in FIG. 5, FIG. 8 is a cross-sectional view showing the first output transistor shown in FIG. 7, and FIG. 9 is a cross-sectional view showing the second voltage generating transistor shown in FIG. 5.

FIG. 7 shows the first output transistor TR1, the first control transistor TR3, and the second control transistor TR4 of the third driving stage SRC3 (refer to FIG. 5) and a connection relation therebetween. As described later, the first output transistor TR1, the first control transistor TR3, and the second control transistor TR4 have the same structure.

In more detail, the third driving stage SRC3 includes a first conductive layer, a second conductive layer, a third conductive layer, and an active layer, which are on different layers from each other. The first, second, and third conductive layers include multiple (e.g., plural) electrodes and wirings. The active layer includes multiple (e.g., plural) portions. One or more insulating layers are between the first, second, and third conductive layers.

Figure 8:
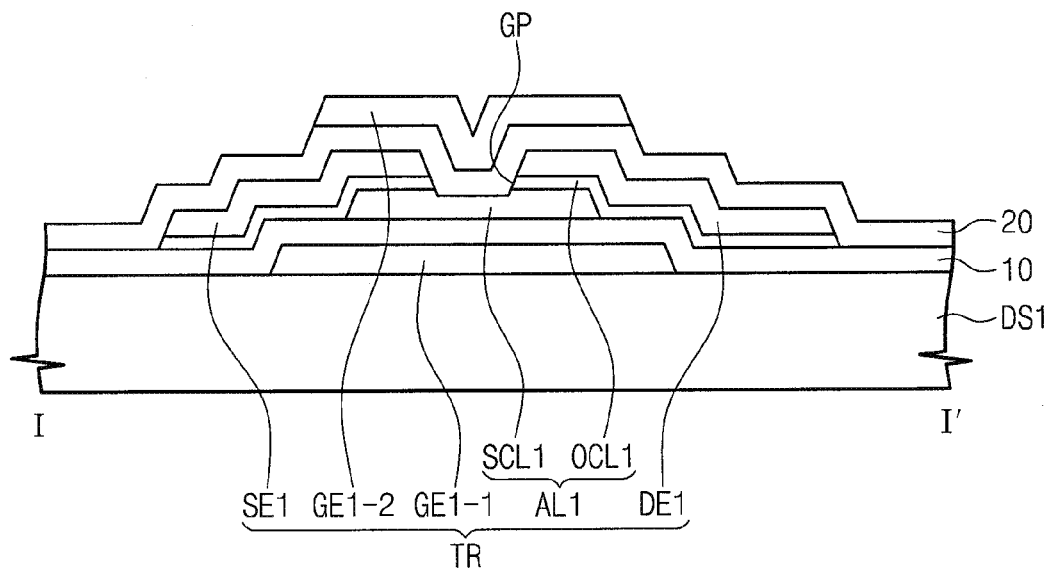
FIG. 8 is a cross-sectional view showing a first output thin film transistor shown in FIG. 7.
Figure 9:
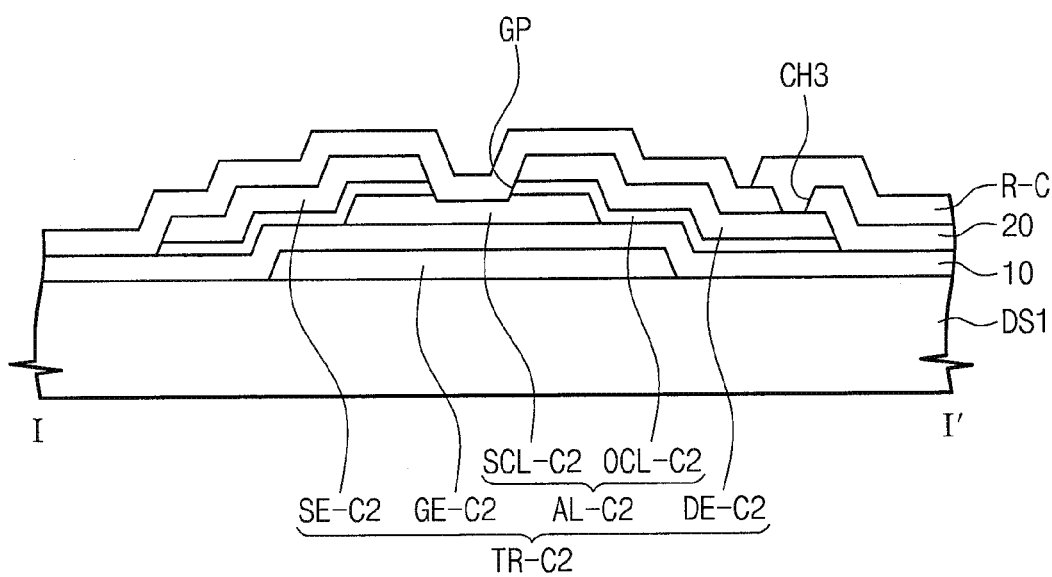
FIG. 9 is a cross-sectional view showing a second voltage generating thin film transistor shown in FIG. 5.

Referring to FIGS. 7 and 8, portions of the first conductive layer form first control electrodes GE1-1, GE3-1, and GE4-1 of the transistors TR1, TR3, and TR4, respectively. Portions of the second conductive layer form input electrodes SE1-1, SE3-1, and SE4-1 and output electrodes DE1-1, DE3-1, and DE4-1 of the transistors TR1, TR3, and TR4, respectively. Portions of the third conductive layer form second control electrodes GE1-2, GE3-2, and GE4-2 of the transistors TR1, TR3, and TR4, respectively. The portions included in the active layer form the active parts of the transistors TR1, TR3, and TR4.

The second conductive layer includes a first wiring CL10 to couple the transistors TR1, TR3, and TR4. The first wiring CL10 corresponds to the first node N10 shown in FIG. 5. In addition, the third conductive layer includes a second wiring CL20 to couple the second control electrodes GE1-2, GE3-2, and GE4-2 and the output node N30.

The first control electrode GE1-1 of the first output transistor TR1 is coupled to the first wiring CL10 through a first contact hole CH1 formed through the insulating layer between the first conductive layer and the second conductive layer. The first control electrode GE1-1 of the first output transistor TR1 is coupled to the first electrode CE1 of the first capacitor CA1. The output electrode DE1 of the first output transistor TR1 is coupled to the second electrode CE2 of the first capacitor CA1.

The first control electrode GE3-1 of the first control transistor TR3 is coupled to the input electrode SE3 and the input terminal IN of the first control transistor TR3 through a second contact hole CH2 formed through the insulating layer between the first and second conductive layers.

As shown in FIG. 8, the first control electrode GE1-1 of the first output transistor TR1 is on the same layer as that of the control electrode GE of the pixel transistor TR. The first control electrode GE1-1 of the first output transistor TR1 includes the same material as and has the same layer structure as those of the control electrode GE of the pixel transistor TR.

The input electrode SE1 and the output electrode DE1 of the first output transistor TR1 are on the same layer as that of the input electrode SE and the output electrode DE of the pixel transistor TR. The input electrode SE1 and the output electrode DE1 of the first output transistor TR1 include the same material as and have the same layer structure as those of the input electrode SE and the output electrode DE of the pixel transistor TR.

The second control electrode GE1-2 of the first output transistor TR1 is on the same layer as that of the pixel electrode PE (refer to FIG. 3). The second control electrode GE1-2 of the first output transistor TR1 includes the same material as and has the same layer structure as those of the pixel electrode PE. The active part AL1 of the first output transistor TR1 is on the same layer as that of the active part AL of the pixel transistor TR. The first conductive layer, the second conductive layer, the third conductive layer, and the active layer are formed by the same processes as those applied to form corresponding elements of the pixel.

The first and second insulating layers 10 and 20 shown in FIG. 8 form the same layers together with the first and second insulating layers 10 and 20 shown in FIG. 3. In FIG. 8, the second control electrode GE1-2 of the first output transistor TR1 is on the second insulating layer 20, but it should not be limited thereto or thereby. That is, the third insulating layer 30 (refer to FIG. 3) may be between the second control electrode GE1-2 of the first output transistor TR1 and the second insulating layer 20.

The transistors of the second output part 112 (refer to FIG. 5), the holding part 114 (refer to FIG. 5), the stabilizing part 115 (refer to FIG. 5), and the pull-down part 116 (refer to FIG. 5) may have the same structure as the first output transistor TR1, the first control transistor TR3, and the second control transistor TR4, except for the second control electrode thereof.

Referring to FIG. 9, the second voltage generating transistor TR-C2 includes a control electrode GE-C2, an active part AL-C2, an input electrode SE-C2, and an output electrode DE-C2. The output electrode DE-C2 of the second voltage generating transistor TR-C2 is coupled to the resistor R-C through a third contact hole CH3 formed through the second insulating layer 20. The resistor R-C includes the same material as and has the same layer structure as those of the pixel electrode PE.

The second voltage generating transistor TR-C2 has the same structure as that of the first output transistor TR1 shown in FIG. 8 except for the second control electrode GE1-2. In some embodiments, the first voltage generating transistor TR-C1 has the same structure as that of the second voltage generating transistor TR-C2.

Consequently, the first voltage generating transistor TR-C1 and the second voltage generating transistor TR-C2 have the same structure as that of the second output transistor TR2. In other words, the transistors included in the third driving stage SRC3 have the same structure except for the second control electrode. The transistors included in the third driving stage SRC3 are formed through the same process.

As described above, since the transistors included in the third driving stage SRC3 have the same structure, the transistors included in the third driving stage SRC3 have the same channel characteristics. The transistors included in the third driving stage SRC3 have the same threshold voltage. The threshold voltage is determined depending on a channel length, a channel width, an etch rate, and a doping concentration of the active part of the transistors.

The transistors included in the third driving stage SRC3 may have a channel characteristic different from the desired channel characteristic due to a manufacturing process error. This is because numerical values of the active part are different from designed numerical values.

A transistor having a back channel etch structure or an etch-back structure, in which no etch stopper exists, as the first output transistor TR1 (refer to FIG. 8) and the second voltage generating transistor TR-C2 (refer to FIG. 9) includes the active parts AL1 and AL-C2 in which a groove portion GP is formed. Due to the manufacturing process error, the groove portion GP may have a depth deeper than a designed depth. The first output transistor TR1 and the second voltage generating transistor TR-C2 may have the channel characteristics different from the designed channel characteristics due to the error in depth of the groove portion GP.

Figure 10:
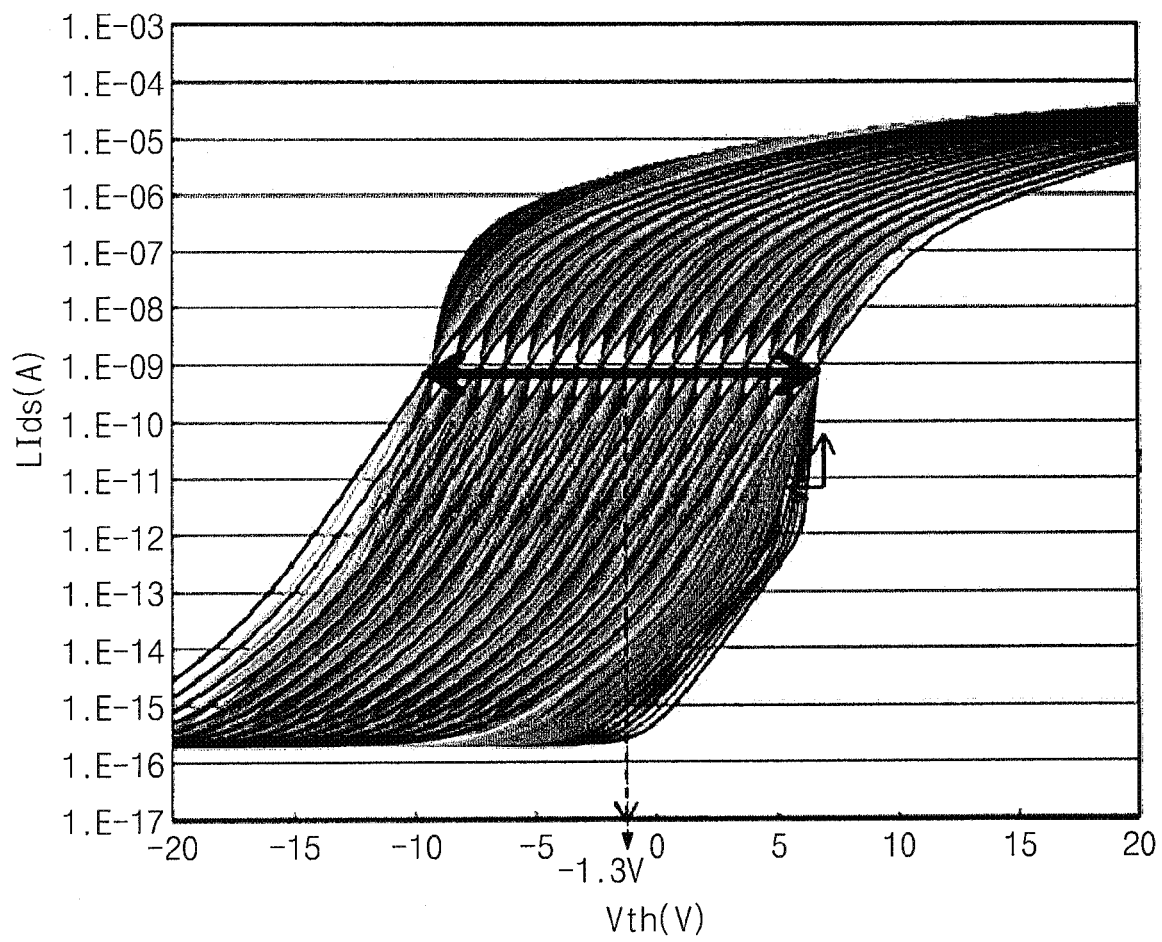
FIG. 10 is a graph showing a threshold voltage as a function of a leakage current of a thin film transistor.

FIG. 10 is a graph showing a threshold voltage as a function of a leakage current of a thin film transistor.

As shown in FIG. 10, the transistor has a threshold voltage (Vth) and a leakage current (Lids), which are varied according to the numerical values in the manufacturing process. The transistor has the threshold voltage from about −9.3 volts to about 7.3 volts, which generates the leakage current of about 1 nA.

For instance, when an NMOS transistor has the threshold voltage of about −1.3 volts, the leakage current of about 1 nA is generated. Since the NMOS transistor has the negative threshold voltage, defects may occur in the NMOS transistor, the gate driving circuit including the NMOS transistor, and the display device including the gate driving circuit.

The control voltage generator 117 according to the present example embodiment applies the control voltage Vc determined by taking the channel characteristic into consideration to the transistor having the threshold voltage different from the designed threshold voltage, and thus the threshold voltage of the transistor may be controlled. For instance, the control voltage generating part 117 applies the control voltage Vc to the NMOS transistor to shift the negative threshold voltage to a positive threshold voltage. Thus, defects may be reduced (e.g., prevented) in the NMOS transistor, the gate driving circuit including the NMOS transistor, and the display device including the gate driving circuit.

Figure 11:
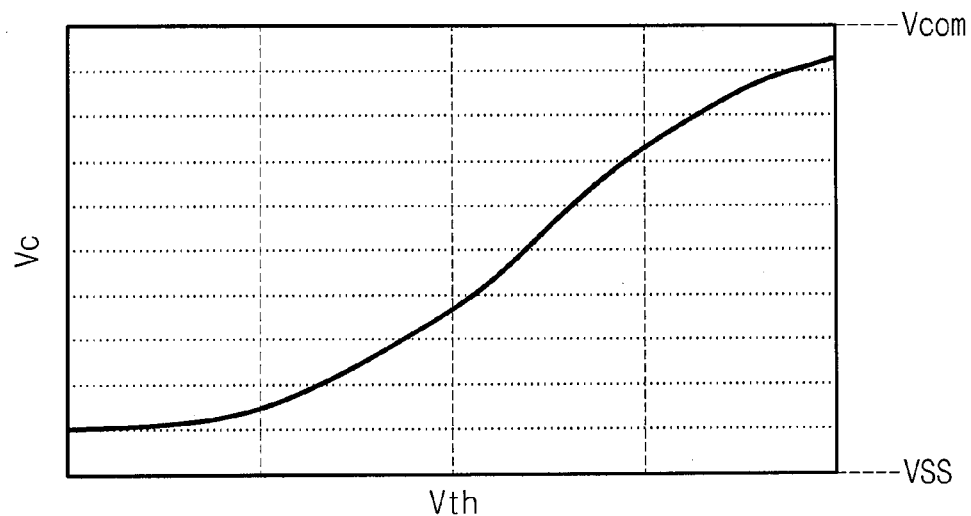
FIG. 11 is a graph showing a threshold voltage as a function of a control voltage of first and second voltage generating thin film transistors.

FIG. 11 is a graph showing a threshold voltage as a function of a control voltage of the first and second voltage generating thin film transistors.

Referring to FIG. 11, the control voltage Vc has a voltage level changed depending on the threshold voltage Vth of the first and second voltage generating transistors TR-C1 and TR-C2. The control voltage Vc has a value similar to the off voltage VSS as the threshold voltage Vth of the first and second voltage generating transistors TR-C1 and TR-C2 becomes small, and has a value similar to the common voltage Vcom as the threshold voltage Vth of the first and second voltage generating transistors TR-C1 and TR-C2 becomes large.

The control voltage Vc may have the negative value when the threshold voltage Vth determined by the numerical value in the manufacturing process of the first and the second voltage generating transistors TR-C1 and TR-C2 is smaller than a specific positive value. The control voltage Vc may have the positive value when the threshold voltage Vth determined by the numerical value in the manufacturing process of the first and the second voltage generating transistors TR-C1 and TR-C2 is equal to or greater than the specific positive value. The threshold voltage Vth of the first and second voltage generating transistors TR-C1 and TR-C2, which allows the control voltage Vc to become zero (0), may be changed depending the numerical value in the manufacturing process of the first and second voltage generating transistors TR-C1 and TR-C2.

The control voltage Vc may have the negative value when the threshold voltage Vth determined by the numerical value in the manufacturing process of the first and the second voltage generating transistors TR-C1 and TR-C2 is zero (0). The threshold voltage Vth determined by the numerical value in the manufacturing process of the first and the second voltage generating transistors TR-C1 and TR-C2 may have the positive value when the control voltage Vc is zero (0).

Figure 12:
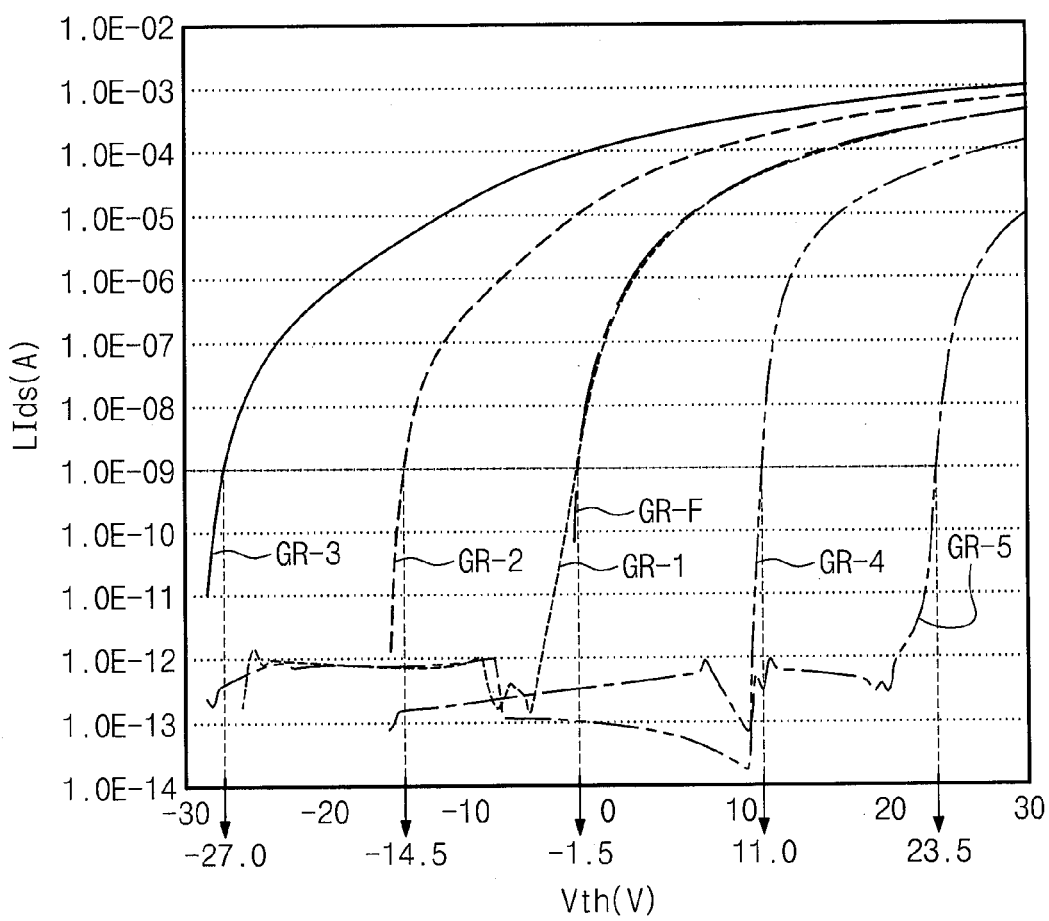
FIG. 12 is a graph showing a threshold voltage as a function of a leakage current according to a control voltage applied to the thin film transistor.

FIG. 12 is a graph showing a threshold voltage as a function of a leakage current according to a control voltage applied to the transistor. First, second, third, fourth, and fifth graphs (or curves) GR-1, GR-2, GR-3, GR-4, and GR-5, represent the relationship between the threshold voltage and the leakage current when the control voltage Vc is about 0 volts, about 10 volts, about 20 volts, about −10 volts, and about −20 volts, respectively. A sixth graph GR-F represents the relationship between the threshold voltage and the leakage current of the transistor including a second control electrode that is floated. The threshold voltages, which generate the leakage current of about 1 nA, are about −1.5 volts, about −14.5 volts, about −27.0 volts, about 11.0 volts, and about 23.5 volts, respectively, in the first, second, third, fourth, and fifth graphs GR-1, GR-2, GR-3, GR-4, and GR-5.

The first graph GR-1 and the sixth graph GR-F have the similar relationship between the threshold voltage and the leakage current. Referring to the second and third graphs GR-2 and GR-3, the graphs are shifted to the left as the voltage level of the control voltage Vc becomes large when compared to the first graph GR-1. Referring to the fourth and fifth graphs GR-4 and GR-5, the graphs are shifted to the right as the voltage level of the control voltage Vc becomes large when compared to the first graph GR-1.

For instance, when the threshold voltage Vth determined by the numerical value in the manufacturing process of the NMOS transistor has the negative value, the threshold voltage of the NMOS transistor may be shifted to the positive threshold voltage by applying the negative control voltage Vc to the second control electrode of the NMOS transistor. In the present example embodiment, each of the first output transistor TR1, the first control transistor TR3, and the second control transistor TR4 may be the NMOS transistor.

When the threshold voltage determined by the numerical value in the manufacturing process of the first output transistor TR1 has the negative value greater than the designed value or the positive value greater than the designed value, the control voltage generating part 117 applies the control voltage Vc, which is determined by taking the channel characteristic on the basis of the numerical value of the first output transistor TR1 into consideration, to the second control electrode GE1-2 of the first output transistor TR1 such that the threshold voltage of the first output transistor becomes similar to the designed value. Accordingly, the first output transistor TR1 may be stabilized regardless of the manufacturing process error. As described above, the threshold voltage of the first output transistor TR1 is controlled, and thus the leakage current of the first output transistor TR1 is reduced.

Therefore, the third driving stage SRC3 may output the gate signal GS3 with a set level (e.g., a predetermined level) or more. When the gate signal GS3 having the set level (e.g., the predetermined level) or more is applied to the transistor of the pixel, the pixels may be charged with the pixel voltage corresponding to the data signal, thereby reducing (e.g., preventing) the displaying of the horizontal line.

The first and second control transistors TR3 and TR4 applied with the control voltage Vc may be stabilized regardless of the manufacturing process error. Thus, the electric potential of the first node N10 (refer to FIG. 5) may have the level appropriate to turn on or off the first output transistor TR1 in the turn-on period of the first and second control transistors TR3 and TR4. The first output transistor TR1 may be accurately turned on or off. Accordingly, the gate signal GS3 is not delayed.

In addition, since the leakage current of the first output transistor TR1, the first control transistor TR3, and the second control transistor TR4 is reduced, power consumption of the display device is reduced. Further, since the transistors included in the second output part 112 (refer to FIG. 5), the holding part 114 (refer to FIG. 5), the stabilizing part 115 (refer to FIG. 5), the pull-down part 116 (refer to FIG. 5) further include the control electrode applied with the control voltage Vc, the leakage current in each of the second output part 112 (refer to FIG. 5), the holding part 114 (refer to FIG. 5), the stabilizing part 115 (refer to FIG. 5), the pull-down part 116 (refer to FIG. 5) may be reduced, and the power consumption of the display device may be further reduced.

Although the example embodiments of the present invention have been described, it is understood that the present invention should not be limited to these example embodiments, but various changes and modifications can be made by one having ordinary skill in the art within the spirit and scope of the present invention as defined hereinafter by the claims, and equivalents thereof.

What is claimed is:
1. A gate driving circuit comprising:
   a plurality of driving stages configured to apply gate signals to a plurality of pixels of a display panel, one driving stage of the driving stages comprising:
   a thin film transistor including a first control electrode, an active part overlapping the first control electrode, an input electrode overlapping the active part, an output electrode overlapping the active part, and a second control electrode on the first control electrode and the active part; and a control voltage generator configured to supply a control voltage determined according to a channel characteristic of the thin film transistor to the second control electrode and to include a voltage generating thin film transistor including an active part having a same channel characteristic as the active part of the thin film transistor.

2. The gate driving circuit of claim 1, wherein the control voltage generator comprises:
a first voltage generating thin film transistor including an input electrode configured to receive a first voltage, a control electrode configured to receive the first voltage, an active part, and an output electrode coupled to an output node from which the control voltage is output;
a second voltage generating thin film transistor including an input electrode configured to receive a second voltage having a level greater than that of the first voltage, a control electrode configured to receive the second voltage, an active part, and an output electrode; and
a resistor coupled to the output electrode of the second voltage generating thin film transistor and the output node.

3. The gate driving circuit of claim 2, wherein the display panel comprises a plurality of gate lines configured to apply the gate signals to the pixels, and the first voltage has a substantially same level as that of an off voltage that discharges the gate lines.

4. The gate driving circuit of claim 2, wherein the second voltage has a substantially same level as that of a common voltage applied to the pixels.

5. The gate driving circuit of claim 1, wherein each of the thin film transistor and the voltage generating thin film transistor has a back channel etch (BCE) structure, and the active part of the voltage generating thin film transistor has a substantially same shape as that of the active part of the thin film transistor.

6. The gate driving circuit of claim 5, wherein each of the thin film transistor and the voltage generating thin film transistor is an NMOS thin film transistor.

7. The gate driving circuit of claim 5, wherein each of the active part of the voltage generating thin film transistor and the active part of the thin film transistor comprises a semiconductor layer and an ohmic contact layer, and the semiconductor layer comprises a metal oxide semiconductor.

8. The gate driving circuit of claim 1, wherein the driving stages are coupled to each other one after another and sequentially output the gate signals.

9. The gate driving circuit of claim 8, wherein the one driving stage comprises a clock terminal configured to receive a clock signal and an output terminal configured to output a corresponding gate signal of the gate signals, and the thin film transistor is configured to receive the clock signal and to output the corresponding gate signal.

10. The gate driving circuit of claim 1, wherein the one driving stage comprises:
a first output configured to receive a clock signal and to output a corresponding gate signal of the gate signals;
a second output configured to output a carry signal;
a controller configured to control an on/off operation of the first and second outputs;
a holder configured to hold an output terminal of the first output at an off voltage during an off period of the first output;
a stabilizer configured to reduce rippling of the gate signal and the carry signal due to the clock signal; and a reducer configured to reduce the output terminal of the first output to the off voltage during the off period of the first output,
wherein each of the first output, the second output, the controller, the holder, the stabilizer, and the reducer is included in the thin film transistor.

11. A display device comprising:
a display panel including a plurality of gate lines, a plurality of data lines insulated from the gate lines and crossing the gate lines, and a plurality of pixels, each of the pixels being coupled to a corresponding gate line of the gate lines and a corresponding data line of the data lines;
a data driving circuit configured to apply data signals to the data lines; and
a gate driving circuit including a plurality of driving stages configured to apply gate signals to the gate lines, one driving stage of the driving stages comprising:
a thin film transistor including a first control electrode, an active part overlapping the first control electrode, an input electrode overlapping the active part, an output electrode overlapping the active part, and a second control electrode on the first control electrode and the active part; and
a control voltage generator configured to supply a control voltage determined according to a channel characteristic of the thin film transistor to the second control electrode and to include a voltage generating thin film transistor including an active part having a same channel characteristic as the active part of the thin film transistor.

12. The display device of claim 11, wherein each of the pixels comprises:
a pixel thin film transistor coupled to the corresponding gate line and the corresponding data line; and
a liquid crystal capacitor including a first electrode electrically coupled to the pixel thin film transistor and a second electrode facing the first electrode such that a liquid crystal layer is between the first and second electrodes.

13. The display device of claim 12, wherein the pixel thin film transistor comprises a control electrode, an active part overlapping the control electrode, an input electrode overlapping the active part, and an output electrode overlapping the active part, the control electrode of the pixel thin film transistor is on a same layer as that of the first control electrode of the thin film transistor, and the active part of the pixel thin film transistor is on a same layer as that of the active part of the thin film transistor.

14. The display device of claim 13, wherein the control voltage generator comprises:
a first voltage generating thin film transistor including an input electrode configured to receive a first voltage, a control electrode configured to receive the first voltage, an active part, and an output electrode coupled to an output node from which the control voltage is output;
a second voltage generating thin film transistor including an input electrode configured to receive a second voltage having a level greater than that of the first voltage, a control electrode configured to receive the second voltage, an active part, and an output electrode; and
a resistor coupled to the output electrode of the second voltage generating thin film transistor and the output node.

15. The display device of claim 14, wherein the first voltage has a substantially same level as that of an off voltage that discharges the corresponding gate line.

16. The display device of claim 14, wherein the second voltage has a substantially same level as that of a common voltage applied to the second electrode of the liquid crystal capacitor.

17. The display device of claim 13, wherein each of the thin film transistor, the voltage generating thin film transistor, and the pixel thin film transistor has a back channel etch (BCE) structure, and the active part of the voltage generating thin film transistor has a substantially same shape as that of the active part of the thin film transistor and that of the active part of the pixel thin film transistor.

18. The display device of claim 17, wherein each of the active part of the voltage generating thin film transistor, the active part of the thin film transistor, and the active part of the pixel thin film transistor comprises a semiconductor layer and an ohmic contact layer, and the semiconductor layer comprises a metal oxide semiconductor.

19. The display device of claim 11, wherein the one driving stage comprises a clock terminal configured to receive a clock signal and an output terminal configured to output a corresponding gate signal of the gate signals, and the thin film transistor is configured to receive the clock signal and to output the corresponding gate signal.

20. The display device of claim 11, wherein the one driving stage comprises:
- a first output configured to receive a clock signal and to output a corresponding gate signal of the gate signals;
- a second output configured to output a carry signal;
- a controller configured to control an on/off operation of the first and second outputs;
- a holder configured to hold an output terminal of the first output at an off voltage during an off period of the first output;
- a stabilizer configured to reduce rippling of the gate signal and the carry signal due to the clock signal; and
- a reducer configured to reduce the output terminal of the first output to the off voltage during the off period of the first output,
- wherein each of the first output, the second output, the controller, the holder, the stabilizer, and the reducer is included in the thin film transistor.

* * * * *